United States Patent

Kang et al.

Patent Number: 5,854,113
Date of Patent: Dec. 29, 1998

[54] METHOD FOR FABRICATING POWER TRANSISTOR USING SILICON-ON-INSULATOR (SOI) WAFER

[75] Inventors: Wong-Gu Kang; Jong-Son Lyu; Sung-Weon Kang, all of Daejeon, Rep. of Korea

[73] Assignee: Electronics and Telecommunications Research Institute, Daejeon, Rep. of Korea

[21] Appl. No.: 742,157

[22] Filed: Nov. 1, 1996

[51] Int. Cl.$^6$ .......................... H01L 21/336; H01L 21/26
[52] U.S. Cl. ............................. 438/294; 438/430
[58] Field of Search ................... 148/DIG. 126; 438/151, 311, 429, 430, 294

[56] References Cited

U.S. PATENT DOCUMENTS

| 5,389,561 | 2/1995 | Gomi | 438/311 |
| 5,554,546 | 9/1996 | Malhi | 438/294 |

FOREIGN PATENT DOCUMENTS 0562271   9/1993   European Pat. Off. .

*Primary Examiner*—Jey Tsai
*Assistant Examiner*—Michael S. Lebentritt
*Attorney, Agent, or Firm*—Antonelli, Terry, Stout & Kraus, LLP

[57] ABSTRACT

An improved method for fabricating a power transistor using an SOI wafer which is capable of using an SOI substrate having a thin Si film, which includes the steps of a first step for forming an SOI layer having a first oxidation film and a single crystal Si thin film by implanting an oxygen ion with respect to a single crystalline substrate and heat-treating the same, a second step for forming source and drain electrodes of a first poly-crystal Si film encircled by a third oxidation film on the SOI substrate, a third step for forming a shallow junction by ion-implanting with respect to the source and drain electrodes of the first poly-crystalline Si film, a fourth step for forming a second poly-crystalline Si film by a reactive ion etching method with respect to the third oxide film so as to form a gate electrode, and a fifth step for stabilizing a voltage at a lower channel portion, which voltage is supplied thereto through a p-type region of the SOI layer, and for ion-implanting a p-type dopant ion using a photoresistive film as a mask so as to supply a voltage to the lower portion of the SOI layer beneath the channel portion, and for forming source and drain electrode.

9 Claims, 6 Drawing Sheets

METHOD FOR FABRICATING POWER TRANSISTOR USING SILICON-ON-INSULATOR (SOI) WAFER

BACKGROUND OF THE INVENTION

1. Field of the Invention

The present invention relates to a method for fabricating a power transistor using a silicon-on-insulator wafer, and particularly, to an improved method for fabricating a power transistor using a silicon-on-insulator wafer, wherein power transistor is capable of generating a high voltage and current drive using a silicon-on-insulator wafer having a thin surface silicon film which is adaptable to a control circuit having a fully depleted layer.

2. Description of the Conventional Art

Conventionally, a smart power integrated circuit (IC) includes a control circuit and a power device which are integrated on one substrate, with the smart power IC being used for controlling a power-based electric apparatus such as a motor.

When the smart power IC is fabricated on a silicon-on-insulator (SOI) substrate, it is possible to achieve a high speed operation of the control circuit and to generate a high voltage drive.

However, when fabricating the smart power IC using the SOI substrate, it is impossible to fabricate a control circuit which has a high speed operation capability and a fully depleted layer, and a power device which is capable of generating a high voltage drive because the control circuit having the fully depleted layer requires a thin film SOI, and the power device requires a thick film SOI for a grounded body, respectively.

FIG. 1A illustrates the construction of a conventional power transistor which was disclosed by Japanese Patent No. J0653310, Jan. 11, 1992. As shown therein, the conventional power transistor was fabricated by using an SOI substrate having thick Si film. The power device has an insulated gate bipolar transistor(IGBT) structure with a trench 7 as the drain electrode.

In the drawing, reference numerals 1 and 2 denote an n$^+$ diffusion layer, reference numeral 3 denotes a P$^-$-diffusion layer, reference numeral 5 denotes a surface oxide film, reference numeral 9 denotes the thickness of an intermediate oxide film, reference numeral 10 denotes a substrate, reference numeral 11 denotes a semiconductor substrate, reference numeral 12 denotes an intermediate oxide film, reference numeral 71 denotes a silicon oxide film, and reference numeral 72 denotes a poly-silicon.

The above-described conventional power transistor is directed to reducing an 'on' resistance using the side wall which is used as the drain electrode. Namely, it is good for fabricating the power device; however, it is impossible to integrate the power transistor and the control circuit at the same time.

FIG. 1B illustrates the construction of a conventional power semiconductor entitled "a high voltage structure with oxide isolated source and resurf drift region in bulk silicon" which was disclosed by EPO No. EPO562271 A1, Mar. 26, 1992. As shown therein, the above conventional art is directed to using a thin film SOI including oxidized materials 20a and 20b and a substrate 12. A highly doped density drain region 14 is formed on a bulk Si substrate 12. A source electrode 22b, a poly-crystalline gate electrode 30, and a lightly doped density drain region 16 are formed SOI by a lateral overgrowth method.

In the drawing, reference numeral 18 denotes a diffusion contact, reference numeral 22b denotes an n$^+$ type drain bridge, reference numeral 28 denotes a gate dielectric such as silicon oxide, reference 32 denotes a gate contact, reference numeral 34 denotes a source contact, reference numeral 36 denotes a drain contact, and reference numeral 40 denotes an NMOS transistor.

Since the above-described conventional patent is directed to implementing a power device on the SOI wafer having a thin Si film, the lower substrate electrode of a channel 26 (a p-type poly-crystal silicon layer) is disadvantageously floated.

SUMMARY OF THE INVENTION

Accordingly, it is an object of the present invention to provide a method for fabricating a power transistor using an SOI wafer which overcomes the problems encountered in the conventional method of fabricating a power transistor.

It is another object of the present invention to provide an improved method for fabricating a power transistor using an SOI wafer which is capable of using an SOI substrate having a thin Si film. In addition, the method according to the present invention is related to an IGBT type power device in which a lower portion of the SOI layer beneath the channel is connected with a source electrode, so that a high voltage and current drive is made.

To achieve the above objects, there is provided a method for fabricating a power transistor using an SOI wafer which includes the steps of forming an SOI substrate having a first oxide film and a single crystal Si thin film by implanting an oxygen ion with respect to a single crystal substrate and heat-treating the same, forming source and drain electrodes of a first polycrystalline, Si film encircled by a third oxide film on the SOI substrate, forming a shallow junction film by ion-implanting with respect to the source and drain electrodes of the first polycrystalline Si film, forming a second polycrystalline Si film by a reactive ion etching method with respect to the third oxidation film so as to form a gate electrode, and stabilizing a voltage at a lower channel portion, wherein such voltage is supplied thereto through a p-type region of the SOI substrate, and for ion-implanting a p-type dopant ion using a photoresistive film as a mask so as to supply a voltage to the lower substrate beneath the channel portion, and for forming a metal wire.

In addition, the method for fabricating a power transistor using an SOI wafer is directed to reducing a resistance of source and drain regions of a power device by depositing a refractory metal or a silicide film on a polycrystalline Si film.

Moreover, the method for fabricating a power transistor using an SOI wafer is well adaptable to a method of fabricating a device such as a smart power IC in which a control circuit and a power device are fabricated as one chip.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

FIGS. 2A through 2M illustrate a process for fabricating a power device on a silicon-on-insulator (SOI) substrate having a thin Si film according to the present invention.

Figure 1A:
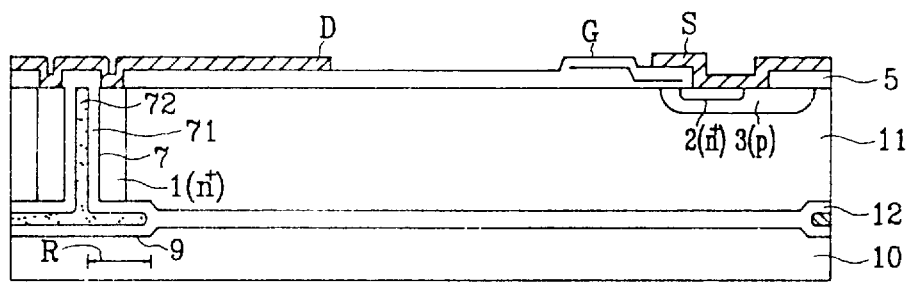
FIGS. 1A and 1B are cross-sectional views illustrating the construction of a conventional power transistor.
Figure 1B:
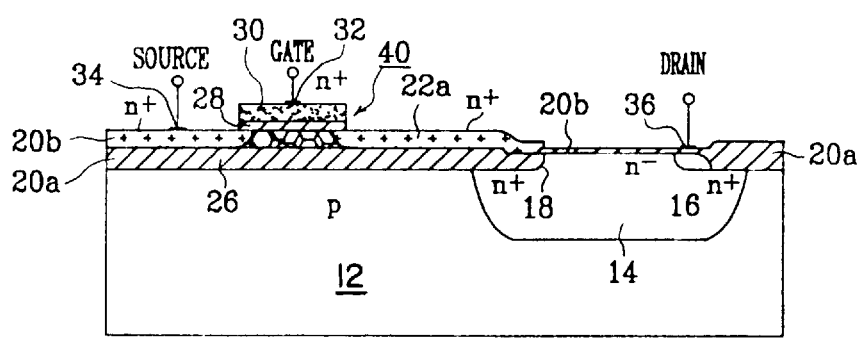
Figure 2A:
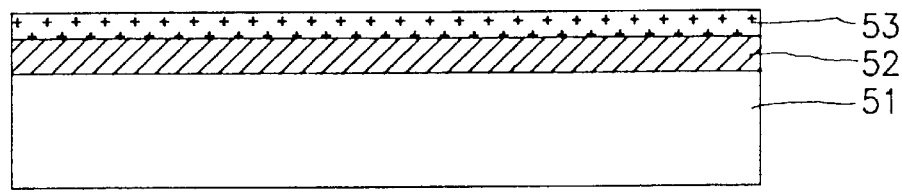
FIGS. 2A through 2M are cross-sectional views illustrating the construction of a power transistor fabricated by using an SOI wafer according to the present invention and a fabrication process thereof.

FIG. 2A illustrates an SOI substrate having Si film.

The SOI substrate includes a first oxide film 52 and a single crystal Si thin film 53.

The single crystal Si substrate 51 uses a p-type Si substrate.

The above-described fabrication method for an SOI wafer is performed as follows. A high density and high energy oxygen ion are implanted with respect to the single crystalline Si substrate 51, and are processed by a heat treatment. As another method for fabricating an SOI wafer, a Si substrate on which an oxide film is formed and a single crystal Si substrate are bonded together, and one side thereof is removed to a predetermined thickness.

Figure 2B:
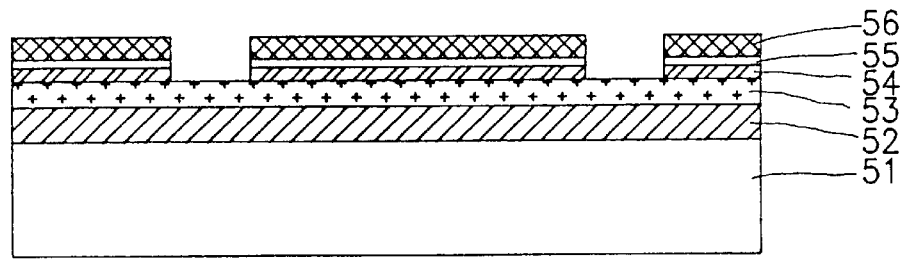

FIG. 2B illustrates a process for forming source and drain regions. As shown therein, a pattern formed for defining source and drain regions on the substrate, on which a sacrifical oxide film 54, a silicon nitride film 55, and second oxide film 56 are deposited, is defined on the single crystalline Si thin film 53. The second oxide film 56 and the silicon nitride film 55 are dry-etched by a reactive ion etching (RIE) method, and the sacrifical oxide film 54 is dry-etched or wet-etched.

Figure 2C:
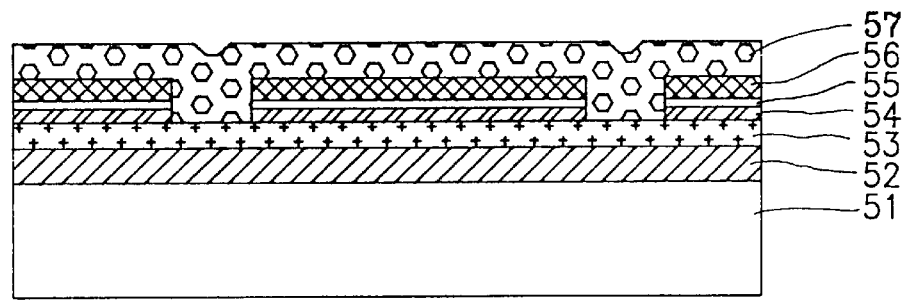

FIG. 2C illustrates an open window which is buried at a portion where the source and drain regions are formed using a poly-crystalline Si film. After the process as shown in FIG. 2B, a first poly-crystalline Si film 57 is deposited by a low pressure chemical vapor deposition (LPCVD) method.

Figure 2D:
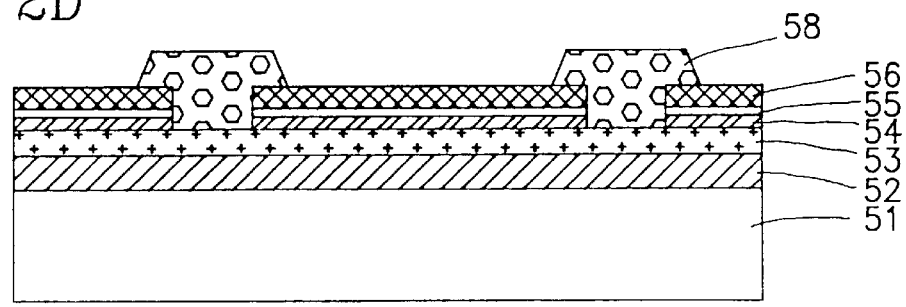

FIG. 2D illustrates an Si film which is formed on the substrate by a selective epitaxial method with respect to which substrate the process shown in FIG. 2C is performed. An Si film 58 is deposited using a window which is open at a portion where the source and drain regions are defined.

Figure 2E:
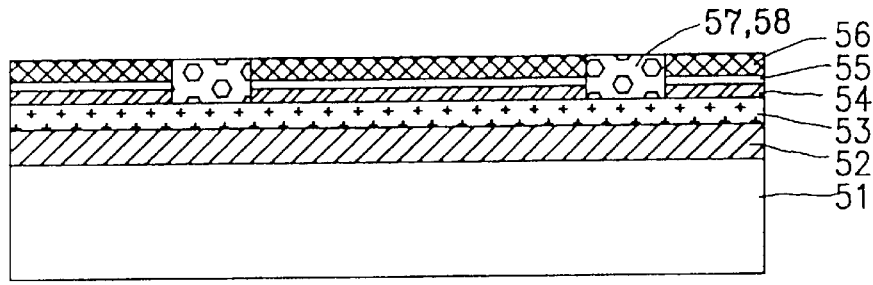

FIG. 2E illustrates a process for removing the first poly-crystalline Si film 57 or the Si layer 58 formed on the second oxide film 56 using a selective polishing method.

Figure 2F:
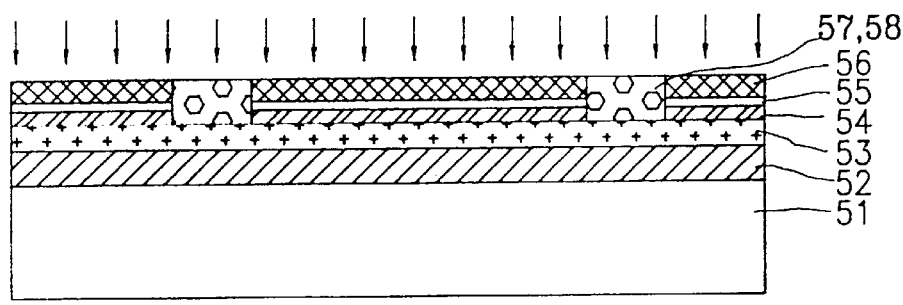

FIG. 2F illustrates a process of ion-implanting with respect to the source and drain regions for forming a junction interface.

Figure 2G:
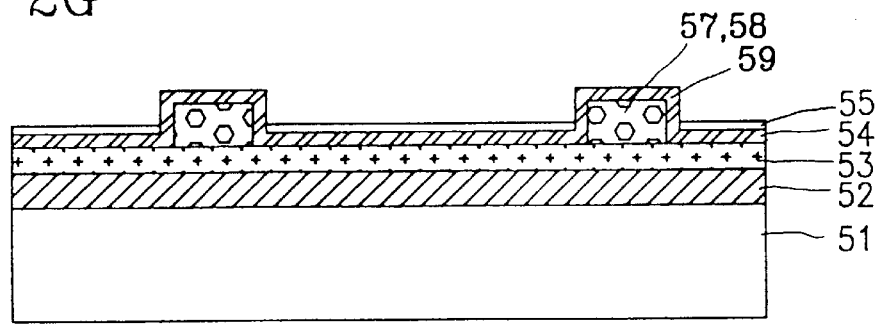

FIG. 2G illustrates a process of removing the second oxide film 56 after implanting an ion for defining source and drain regions. In this process, the second oxide film 56 is wet-etched with a diluted hydro-fluoric acid. Here, the silicon nitride film 55 may be substantially left by using the wet etching method. The silicon nitride film 55 acts as a blocking film when growing a third oxide film 59.

Figure 2H:
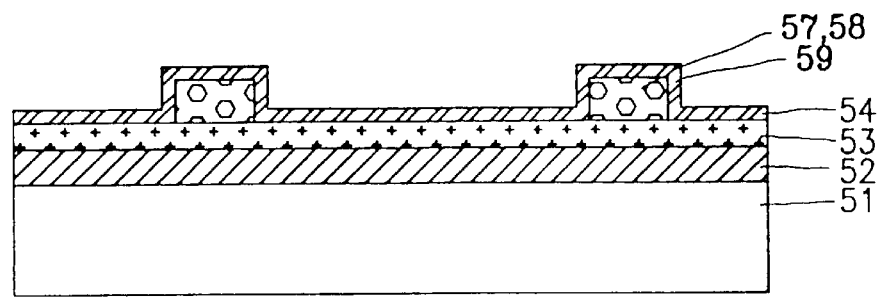

FIG. 2H illustrates a process of growing the third oxide film 59 at the circumferential portion of the first poly-crystalline Si film 57 or the Si layer 58 by restricting the growth of the oxide film using the silicon nitride film 55 as a blocking film. This oxide film 59 acts as the blocking film during the etching process and is used as an insulator film with respect to the poly-crystalline Si film which acts as the blocking film or a gate electrode.

Next, the poly-crystalline film 55 is etched by the RIE method by using the third oxide film 59 as the blocking film.

Figure 2I:
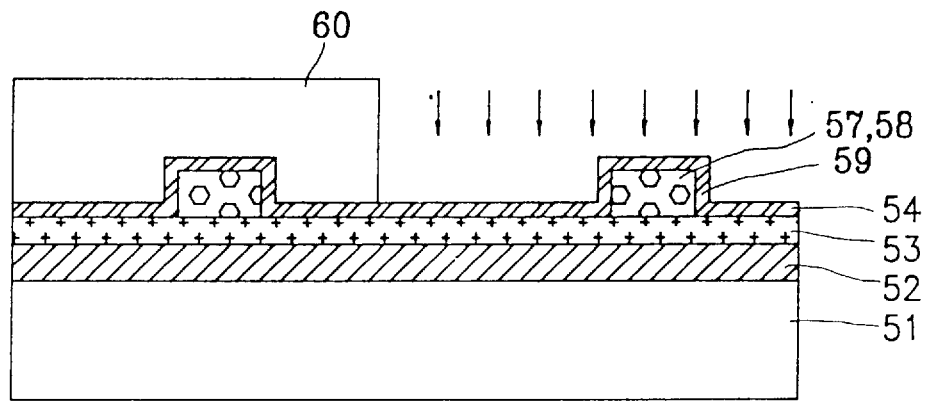

FIG. 2I illustrates a process of an ion implantation for expanding a lightly-doped drain region. A photoresistive film 60 is formed on the substrate using a mask, and an n-type (phosphorus, arsenic, etc) ion implantation is performed.

Figure 2J:
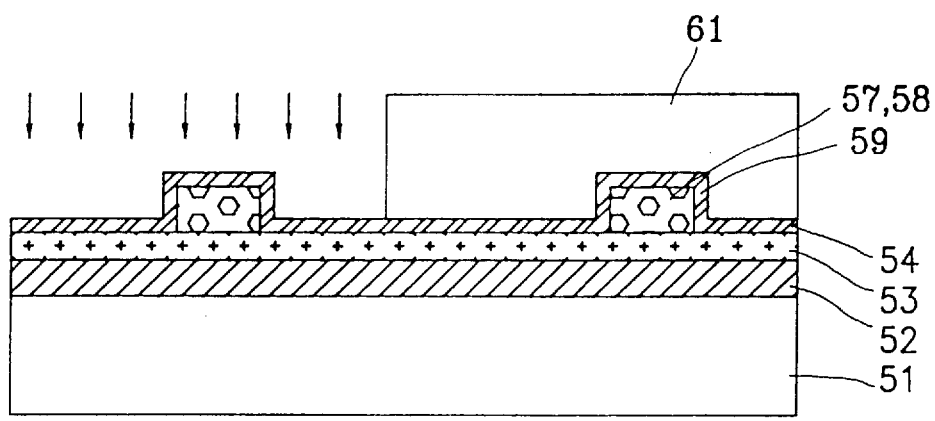

FIG. 2J illustrates a process of an ion implantation of a p-type dopant for controlling the threshold voltage of a device mounted on the substrate. The photoresistive film 61 is formed on the substrate, and a predetermined shaped portion is defined by using a mask, and a p-type (boron, $BF_2$, etc) ion implantation is performed.

Above-described processes as shown in FIGS. 2I and 2J may be performed just after the process as shown in FIG. 2A.

Figure 2K:
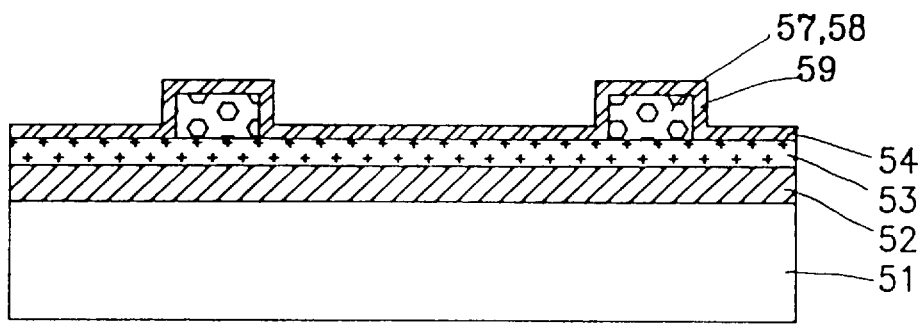

FIG. 2K illustrates a dopant distributions state after an ion implantation is performed in the process as shown in FIG. 2J.

Figure 2L:
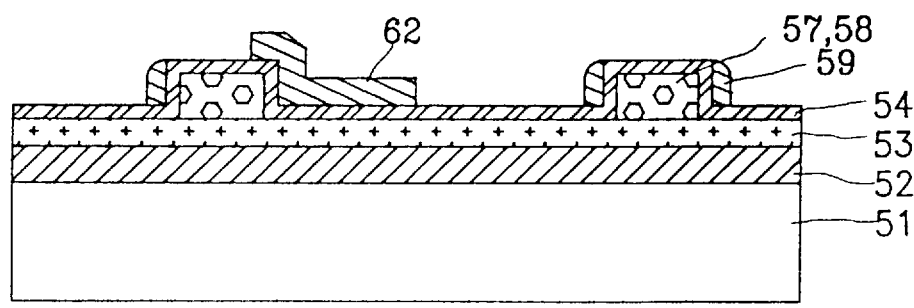

FIG. 2L illustrates a process of forming a gate electrode after a second poly-crystalline Si film 62 which is used as a gate electrode is deposited. Namely, since the second poly-crystalline Si film 62 is etched by the RIE method, there may be formed a residual material which surrounds the poly-crystalline Si film 57 or the Si layer which are used as a source electrode or a drain electrode with respect to the third oxide film 59.

Figure 2M:
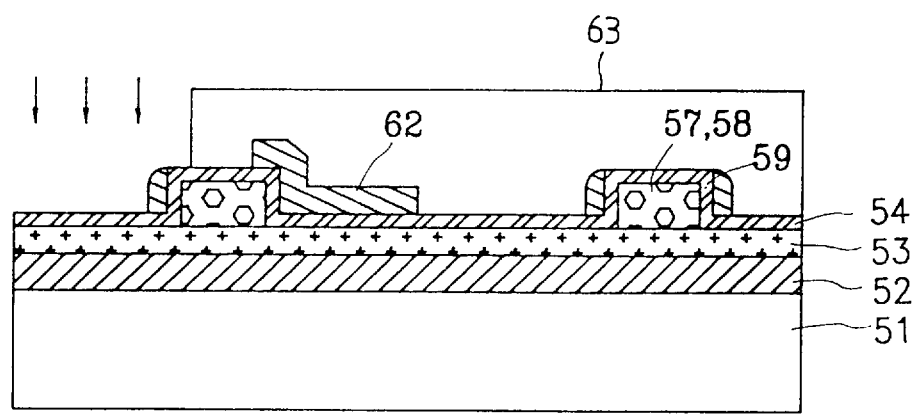

FIG. 2M illustrates a process of performing a p-type ion implantation using a photoresistive film 63 as a mask. This process is directed to stabilizing a voltage at the lower portion of the SOI layer beneath the channel portion and supplying the voltage to the lower portion of the SOI layer beneath the channel portion.

Figure 3:
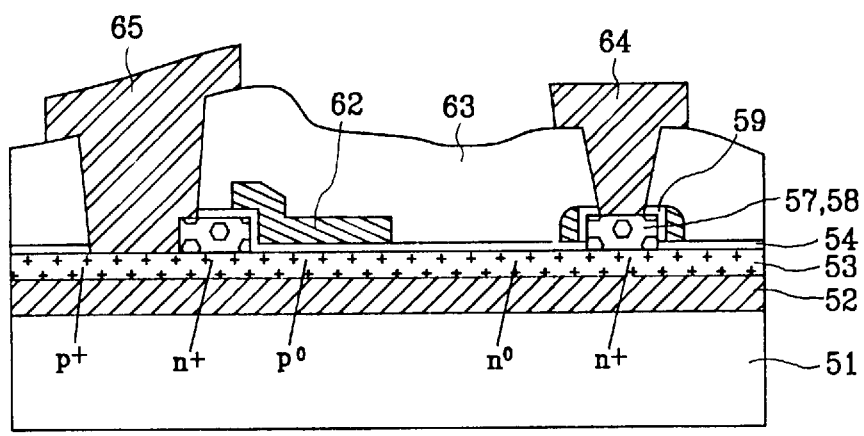
FIG. 3 is a cross-sectional view illustrating the construction of a power transistor fabricated by using an SOI wafer according to the present invention.

The remaining processes are the same as the conventional process. Namely, referring to FIG. 3, after the process as shown in FIG. 2M, an oxide film is deposited, and a contact hole is defined, and a drain electrode 64 and a source electrode 65 are formed.

As described above, the power device according to the present invention is directed to ion-implanting with respect to a poly-crystalline Si film for source and drain regions, so that a shallow junction is made since the penetration depth of the ion is shallow due to the Si film.

Therefore, the power device includes a partially depleted SOI device structure to which a back bias may be applied, and since the power device has an IBGT structure, a high voltage and current drive may be achieved thereto.

In addition, the power device according to the present invention is directed to reducing a resistance of the source and drain regions of the power device by forming a refractory metal or a silicide film on the poly-crystalline Si layers 57 and 58.

Therefore, the method for fabricating the power transistor using the SOI wafer according to the present invention is good for fabricating a device such as a smart power IC in which the control circuit and power device are made in one chip.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a power transistor using a silicon-on-insulator (SOI) wafer, said method comprising the steps of:

a first step of forming an SOI layer having a first oxide film and a single crystalline Si thin film by implanting an oxygen ion on the single crystalline substrate and heat-treating the same;

a second step of forming source and drain electrodes of a first poly-crystalline Si film encircled by a third oxide film on the SOI layer;

a third step of forming a shallow junction by ion-implanting with respect to the source and drain electrodes of the first poly-crystalline Si film;

a fourth step of forming a second poly-crystalline Si film by a reactive ion etching method with respect to the third oxide film so as to form a gate electrode; and a fifth step of ion-implanting a p-type dopant ion using a photoresistive film as a mask so as to supply a voltage to the lower portion of the SOI layer beneath a channel portion.

2. The method of claim 1, wherein said second step includes the sub-steps of:

a first sub-step of sequentially depositing a sacrificial oxide film, a silicon nitride film and a second oxide film on the SOI layer, and etching the same in reverse sequence, and forming source and drain regions;

a second sub-step of depositing a first poly-crystalline Si film in the source and drain regions by LPCVD;

a third sub-step of removing the first poly-crystalline Si film deposited on the second oxide film by a polishing process;

a fourth sub-step of ion-implanting with respect to the source and drain regions so as to form a junction interface, etching the same and removing the second oxide film; and a fifth sub-step of growing a third oxide film at the periphery of the fist poly-crystalline Si film using the silicon nitride film as a blocking film, wherein the third oxide film is used as a blocking and an insulation film, and etching the silicon nitride film.

3. The method of claim 1, wherein said second step includes the sub-steps of:

a first sub-step of sequentially depositing a sacrificial oxide film, a silicon nitride film and a second oxide film on the SOI substrate and etching the same in reverse sequence, and for forming the source and drain regions;

a second sub-step of forming a Si layer on the source and drain regions by a selective epitaxial method;

a third sub-step of removing the Si layer deposited on the second oxide film by a polishing method;

a fourth sub-step of ion-implanting with respect to the source and drain regions so as to form a junction interface and for removing the second oxide film by etching the same; and a fifth sub-step of growing a third oxide film at the periphery of the Si layer using the silicon nitride film as a blocking film, wherein the third oxide film is used as a blocking film and an insulating film, and for etching the silicon nitride film.

4. The method of claim 2, wherein said first sub-step is directed to dry-etching the second oxide film and the silicon nitride film, and removing the sacrificial oxide film by a dry-etching or wet etching method.

5. The method of claim 2, wherein said fourth sub-step is directed to removing the second oxide film by the wet etching method using a diluted hydro-fluoric acid.

6. The method of claim 1, wherein said third step includes the sub-steps of:

a first sub-step of defining a predetermined shaped portion on the substrate by using the photoresistive as a mask and for implanting an n-type ion so as to expand a lightly doped drain region; and a second sub-step for defining a predetermined shaped portion on the SOI layer by using the photoresistive film as a mask and for implanting a p-type ion with respect to the SOI layer so as to control the threshold voltage of the device.

7. The method of claim 6, wherein said n-type ion is P (phosphorus) or As (arsenic).

8. The method of claim 6, wherein said p-type ion is B (boron) or $BF_2$.

9. The method of claim 1, wherein said method is directed to depositing a refractory metal or silicide on the poly-crystalline Si film under the source and drain electrodes of the power device.

* * * * *